US011932935B2

United States Patent
Wright, Jr.

(10) Patent No.: US 11,932,935 B2
(45) Date of Patent: Mar. 19, 2024

(54) DEPOSITION PROCESS FOR MOLYBDENUM OR TUNGSTEN MATERIALS

(71) Applicant: ENTEGRIS, INC., Billerica, MA (US)

(72) Inventor: Robert L. Wright, Jr., Newtown, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/738,352

(22) Filed: May 6, 2022

(65) Prior Publication Data

US 2022/0356563 A1    Nov. 10, 2022

Related U.S. Application Data

(60) Provisional application No. 63/185,659, filed on May 7, 2021.

(51) Int. Cl.
*C23C 16/06* (2006.01)
*C23C 16/455* (2006.01)

(52) U.S. Cl.
CPC ........ *C23C 16/06* (2013.01); *C23C 16/45523* (2013.01)

(58) Field of Classification Search
None
See application file for complete search history.

(56) References Cited

U.S. PATENT DOCUMENTS

| | | | |
|---|---|---|---|
| 2015/0325475 A1* | 11/2015 | Bamnolker | C23C 16/045 438/680 |
| 2016/0284553 A1 | 9/2016 | Suzuki et al. | |
| 2016/0351401 A1 | 12/2016 | Ba et al. | |
| 2019/0088555 A1 | 3/2019 | Xie | |
| 2020/0131628 A1 | 4/2020 | Baum | |
| 2020/0283894 A1 | 9/2020 | Lehn et al. | |
| 2020/0332416 A1* | 10/2020 | Fluit | C23C 16/0281 |
| 2021/0238736 A1 | 8/2021 | Butail et al. | |

FOREIGN PATENT DOCUMENTS

KR    20190024841 A    3/2019

* cited by examiner

*Primary Examiner* — Alexander M Weddle (57) ABSTRACT

Provided is a process for the rapid deposition of highly conformal molybdenum- or tungsten-containing films onto microelectronic device substrates under vapor deposition conditions. In the practice of the invention, a first nucleation step is conducted, while utilizing a generally lower concentration of metal precursor than would ordinarily be utilized in the reaction zone. This utilization of lower metal precursor concentrations can be achieved by way of regulating the temperature of the ampoule (housing the precursor), the concentration of the precursor, pressure in the reaction zone, and the duration of the pulse. In this fashion, a generally lower concentration is utilized to form a nucleation layer of greater than or equal to about 3 Å, or up to about 9, 15, or 25 Å, at which time, the conditions for introducing the precursor are advantageously changed and the concentration of the precursor in the reaction zone is increased for the purpose of bulk deposition.

15 Claims, 9 Drawing Sheets

DEPOSITION PROCESS FOR MOLYBDENUM OR TUNGSTEN MATERIALS

TECHNICAL FIELD

This invention relates to the vapor deposition of molybdenum or tungsten-containing materials onto microelectronic substrates.

BACKGROUND

In consequence of their characteristics of extremely high melting point, low coefficient of thermal expansion, low resistivity, and high thermal conductivity, molybdenum and tungsten are increasingly utilized in the manufacture of semiconductor devices, including use in diffusion barriers, electrodes, photomasks, power electronics substrates, low-resistivity gates, and interconnects.

Such utility has motivated efforts to achieve deposition of molybdenum and tungsten films for such applications that is characterized by high conformality of the deposited film and high deposition rate to accommodate efficient high-volume manufacturing operations. This in turn has informed efforts to develop improved molybdenum and tungsten source reagents useful in vapor deposition operations, as well as improved process parameters utilizing such reagents. Additionally, difficulties are often encountered in the deposition of molybdenum onto certain substrates, such as metals, metal nitrides, dielectric materials (oxides), semiconductors and superconductors insofar as delays in deposition can often be associated with difficulties in establishing nucleation on the substrate surface prior to the desired layer-on-layer deposition. As the deposition temperature is decreased, the overall deposition rate generally decreases and the sensitivity to various substrate surfaces is generally more pronounced.

There remains a need to achieve deposition of molybdenum and tungsten-containing material with higher deposition rates to accommodate efficient high-volume manufacturing operations.

SUMMARY

In certain embodiments, the invention provides a process for the rapid deposition of highly conformal, metal-containing, e.g., molybdenum- and tungsten-containing films onto microelectronic devices under vapor deposition conditions, at reduced temperatures, i.e., below about 400° C., thus enabling the deposition process to be utilized in a wider range of integration schemes including the manufacture of logic devices. In the practice of the invention, a first nucleation step is conducted, while utilizing a generally lower concentration of metal precursor than would ordinarily be present in the reaction zone. This utilization of lower concentrations can be achieved by way of regulating the temperature of the ampoule (housing the precursor), the concentration of the precursor, pressure in the reaction zone, and the duration of the pulse. In this fashion, a generally lower concentration is utilized to form a nucleation layer of greater than or equal to about 3 angstroms (Å), or up to about 9, 15, or 25 Å, at which time, the conditions for introducing the precursor are advantageously changed and the concentration of the precursor in the reaction zone is increased for the purpose of bulk deposition (e.g., greater than 50% higher than concentration used in nucleation step). In one embodiment, a molybdenum precursor, such as $MoO_2Cl_2$ is utilized to deposit a molybdenum-containing film onto a titanium nitride surface, although the process can be recognized as having broad applicability for deposition of molybdenum or tungsten-containing films onto surfaces on which metal nucleation layers are difficult to form (i.e., which generally encounter a nucleation delay) such as metals, metal nitrides, dielectric materials (oxides), semiconductors and superconductors.

DETAILED DESCRIPTION OF THE INVENTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g., 1 to 5 includes 1, 1.5, 2, 2.75, 3, 3.80, 4 and 5).

In general, the deposition process of the invention involves the deposition of a metal nucleation layer of about 3 to about 25 Å as a first step. This first step is advantageously conducted with relatively low concentrations of the precursor in the reaction zone versus the concentrations of precursor used thereafter, i.e., in the formation of the bulk film. In general, utilization of a first, lower concentration of precursor to form a nucleation layer improves the overall processing time for the film deposition of the ultimately desired thickness, and the lower concentration of precursor was surprisingly found to reduce nucleation delay which is typically seen with molybdenum and tungsten precursors on certain substrates. This relatively low concentration of precursor in the reaction zone is in one embodiment about 1 to about 75 molar %, or about 10 to about 50 molar % of that used in the bulk deposition step. All recitation of proportions and concentrations referred to herein will be on a molar basis.

Accordingly, in a first aspect, the invention provides a process for the vapor deposition of a molybdenum or tungsten-containing film onto a surface of a microelectronic device, which comprises introducing into a reaction zone containing the surface, a molybdenum or tungsten precursor and a reducing gas, wherein the precursor has a first precursor concentration in the reaction zone, until a film having a thickness of about 3 Å to about 25 Å has been deposited, followed by introducing into the reaction zone, a molybdenum or tungsten precursor and a reducing gas, wherein the precursor has a second precursor concentration in the reaction zone, until deposition of a molybdenum or tungsten-containing film having a desired thickness is achieved, and wherein the first precursor concentration is about 1 to about 75 percent of the second precursor concentration.

As one of ordinary skill in the art will appreciate, upon the inventive realization that a relatively low concentration of precursor in a first phase of deposition (to form a nucleation layer), followed by a second phase which deposits the bulk of the film, the present invention may be practiced in several modes, e.g., pulsed introduction of precursor and continuous introduction of reducing gas, continuous introduction of precursor and continuous introduction of reducing gas, and pulsed introduction of both precursor and reducing gas, in series, with or without an intervening purge step using an inert gas. Accordingly, one can envision other permutations of these individual regimes, so long as the concentration in the first (nucleation) phase is relatively lower than that used in the subsequent phase where the bulk of the film is deposited on the microelectronic device surface. Moreover, one of ordinary skill, in the selection of one particular precursor over another will first take note of the vapor pressure of that precursor, and then take into consideration the particular tool utilized in the deposition process and its concomitant reaction zone configuration and volume, and then adjust the pressure, concentration, and flow rate of the particular precursor and/or any carrier gas utilized, to achieve the target precursor concentration in each of the two phases referred to herein.

In a second aspect, the invention provides a process for the vapor deposition of a molybdenum or tungsten-containing film onto the surface of a microelectronic device in a reaction zone, the reaction zone operated at a pressure of about 1 to about 1000 Torr and a temperature of about 300° C. to about 1000° C.; wherein the surface is chosen from nitrides, oxides, metals, semiconductors, and superconductors, which comprises:

a. repeatedly introducing into a reaction zone containing the surface, a molybdenum or tungsten precursor in a pulse for a duration of about 0.1 to about 120 seconds followed by a pause of about 1 to about 120 seconds, wherein a first concentration of the precursor in the reaction zone is about 1 to about 5000 ppm at its peak, while continuously introducing into the reaction zone a reducing gas, until a film having a thickness of about 3 Å to about 25 Å has been deposited, and
  b. repeatedly introducing into a reaction zone containing the surface, a molybdenum or tungsten precursor in a pulse for a duration of about 0.1 to about 120 seconds, thereby reaching a second precursor concentration, followed by a pause of about 1 to about 120 seconds; wherein the second concentration of the precursor in the reaction zone is about 1.3 to about 100 times the first precursor concentration, while continuously introducing into the reaction zone a reducing gas, until a film having a desired thickness has been deposited.

In a third aspect, the invention provides a process for the vapor deposition of a molybdenum or tungsten-containing film onto the surface of a microelectronic device in a reaction zone, the reaction zone operated at a pressure of about 1 to about 1000 Torr and a temperature of about 300° C. to about 1000° C.; wherein the surface is chosen from nitrides, oxides, metals, semiconductors, and superconductors, which comprises:

a. continuously introducing into a reaction zone containing the surface, a molybdenum or tungsten precursor, wherein a first concentration of the precursor in the reaction zone is about 1 to about 5000 ppm at its peak, while continuously introducing into the reaction zone a reducing gas until a film having a thickness of about 3 Å to about 25 Å has been deposited, and
  b. continuously introducing into a reaction zone containing the surface, a molybdenum or tungsten precursor, thereby reaching a second precursor concentration, wherein the second concentration of the precursor in the reaction zone is about 1.3 to about 100 times the first precursor concentration, while continuously introducing into the reaction zone a reducing gas, until a film having a desired thickness has been deposited.

In a fourth aspect, the invention provides a process for the vapor deposition of a molybdenum or tungsten-containing film onto a surface of a microelectronic device in a reaction zone, the reaction zone operated at a pressure of about 1 to about 1000 Torr and a temperature of about 300° C. to about 1000° C.; wherein the surface is chosen from nitrides, oxides, metals, semiconductors, and superconductors, which comprises:

a. repeatedly introducing into the reaction zone containing the surface, a molybdenum or tungsten precursor for a first pulse duration of about 0.1 to about 120 seconds, thereby reaching a first concentration of the precursor in the reaction zone, wherein the first concentration of the precursor in the reaction zone is about 1 to about 5,000 ppm, and purging the reaction zone for about 1 to about 120 seconds with an inert gas, and introducing into the reaction zone a reducing gas for a second pulse duration of about 0.1 to about 120 seconds, and purging with an inert gas for a duration of about 1 to about 120 seconds, until a film having a thickness of about 3 Å to about 25 Å has been deposited, and b. repeatedly introducing into the reaction zone containing the surface, a molybdenum or tungsten precursor for a first pulse duration of about 0.1 to about 120 seconds, thereby reaching a second precursor concentration in the reaction zone, wherein the second concentration of the precursor in the reaction zone is about 1.3 to about 100 times the first concentration, and purging the reaction zone for about 1 to about 120 seconds with an inert gas, and introducing into the reaction zone a reducing gas for a second pulse duration of about 0.1 to about 120 seconds, and purging with an inert gas for a duration of about 1 to about 120 seconds, until a film having a desired thickness has been deposited.

In the first through fourth aspects of the invention, various alternate embodiments are envisioned. In one embodiment, the concentration of the precursor in the nucleation (i.e., first) stage will be about 1 to about 5000 ppm, about 10 to about 2000 ppm, or about 20 to about 500 ppm.

In another embodiment, the first precursor concentration is about 10 to about 50 molar %, of the second precursor concentration.

In certain embodiments, the pressure maintained in the reaction zone is about 1 to about 1000 torr, about 20 to about 200 torr, or about 40 to about 120 torr.

In certain embodiments, the temperature of the reaction zone is about 300° to 1000° C., about 325° to about 700° C., or about 350° to 500° C.

In one embodiment, the surface is chosen from nitrides, oxides, metals, semiconductors, and superconductors. Particular examples include silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, photoresists, hard masks, carbon, germanium, germanium-containing, boron-containing, Ga/As, porous inorganic materials, metals such as copper and aluminum, and diffusion barrier layers such as but not limited to TiN, Ti(C)N, TaN, Ta(C)N, Ta, W, or WN. In another embodiment, the surface is titanium nitride.

In another embodiment, the molybdenum and tungsten precursors are chosen from $WCl_6$, $WCl_5$, $WOCl_4$, $MoO_2Cl_2$, $MoCl_5$, and $MoOCl_4$. In another embodiment, the precursor is $MoO_2Cl_2$.

In another embodiment, when a pulsed introduction of precursor is utilized, the pulse "on" times will be about 0.1 seconds to about 120 seconds, about 0.5 seconds to about 60 seconds, or about 0.5 seconds to about 3 seconds. The pulse pause (i.e., "off" times) can be about 1 second to about 120 seconds, about 20 seconds to about 60 seconds, or about 15 seconds to about 40 seconds.

By way of example of the second aspect above, when $MoO_2Cl_2$ is utilized as precursor to deposit a molybdenum-containing film, these prescribed levels of precursor concentration may be generated by utilizing a step where a pre-determined amount of precursor is placed in an ampoule, the ampoule is heated to a pre-determined temperature in order to fill the headspace with a certain partial pressure of precursor vapor, followed by release of precursor vapor and carrier gas into the reaction zone, followed by a pause in the introduction of additional precursor. Throughout this first step, at least one reducing gas is continuously introduced into the reaction zone. Also, during this pause, carrier gas continues to be flowed into the ampoule, which raises the pressure within the ampoule while also effectively reducing the relative concentration in the ampoule. In this first step, the ampoule temperature can, for example, be maintained at a temperature of about 40° to about 70° C., the temperature of the reaction zone can be maintained at about 300° C. to about 1000° C., or about 325° C. to about 700° C., or about 350° C. to about 500° C. In general, during this example of a first step, the process is conducted in a manner such that the concentration of precursor in the reaction zone is about 1 ppm to about 5000 ppm. This concentration can be calculated as partial pressure of the precursor vapor relative to the carrier gas and then further diluted by the reducing gas and any other gases in the chamber.

Once this nucleation layer has been completed, i.e., about 3 Å to about 25 Å, about 3 Å to about 15 Å, or about 3 Å to about 9 Å, the bulk deposition of molybdenum-containing film may be conducted, at relatively higher concentrations, i.e., about 1.3× to about 100× when compared to the nucleation step. Because a nucleation layer has been formed in the first step, the bulk deposition can take place much more quickly, wherein a higher concentration of precursor vapor may be utilized. This process is especially advantageous for those metal precursor/substrate combinations which tend to exhibit nucleation delay, such as oxide and nitride substrates. In the second step, wherein bulk deposition of the metal-containing film takes place, the introduction of precursor into the reaction zone may be continuous or pulsed in nature. In general, for this bulk deposition phase, the concentration of precursor in the reaction zone is maintained at about 1.3× to about 100× in the case of continuous flow of precursor into the reaction zone. In the case of pulsed introduction of precursor into the reaction zone, the concentration will vary from about 1 to about 5000 ppm, depending on the flow rate and duration of the pulse during which precursor is introduced into the reaction zone. In either event, the concentration of precursor in the reaction zone during the bulk deposition will be about 1.3× to about 100× (times) the concentration as is utilized in the first (nucleation) step, with the recited concentrations during such a pulse reflecting the peak concentration achieved during such a pulse.

The utilization of a carrier gas and its flow rate will ultimately depend on the configuration of the deposition tool, its scale of operation, and the particular precursor utilized.

The smallest thickness of film for a continuous monolayer is observed to be about 3 Å. In one embodiment, deposition is continued until a thicker film is achieved to provide a continuous nucleation layer of a tungsten- or molybdenum-containing film, for example, about 6 Å, 9 Å, 15 Å, or 25 Å, thereby enabling further vapor phase deposition, and ultimately providing a tungsten- or molybdenum-containing film of a desired thickness. The molybdenum-containing films were found to be highly conformal, and having in one case a resistivity of 37 μΩ-cm at 39 Å thickness. In one embodiment, the films exhibit resistivity of about 10 to about 1000 μΩ-cm.

The bulk deposition referred to above can thus be utilized to provide the bulk of the film formation, at a deposition rate of about 0.2 to about 2 Å per pulse cycle. Thus, while using the inventive technique of a relatively lower concentration of precursor in an initial phase, to afford a high quality, conformal nucleation layer, the bulk deposition, whether in pulsed or continuous mode can thus provide layer-by-layer deposition of molybdenum- or tungsten-containing film so that the overall process results in a faster formation of a desired final film thickness, for example, of about 25 Å to about 5 microns, all of which than can be achieved using a single metal precursor at a constant, relatively higher concentration in the reaction zone.

Figure 4:
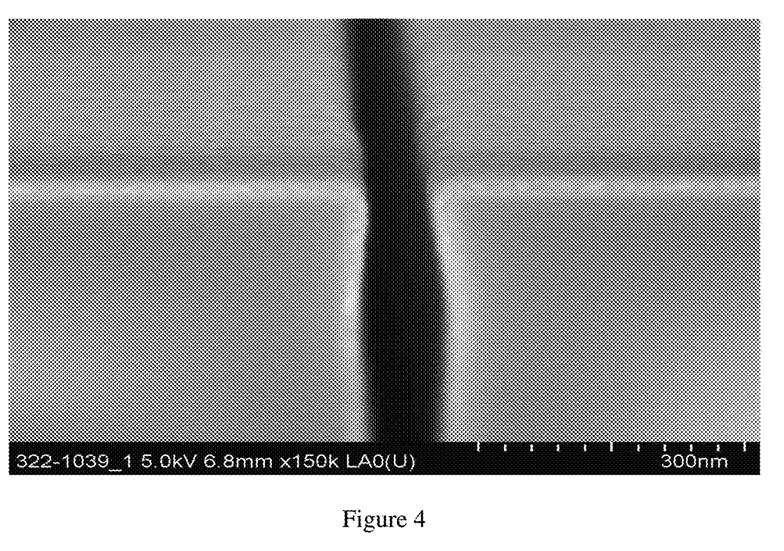
FIG. 4 is a SEM of a film prepared using nucleation step conditions for an extended number of cycles to produce a slightly thicker Mo film on a via structure to show good conformality of the film.

Additionally, it was found that a minimal amount of etching occurs in the practice of the invention. See, for example, FIG. 4. When the nucleation layer is deposited at a lower concentration, there is negligible etching of the substrate and the film deposits with a smooth surface morphology. Once the nucleation layer is continuous and the substrate is not exposed to etching, then the concentration of precursor vapor can be increased. Increasing the concentration of the precursor vapor can both increase the deposition rate and improve step coverage.

In the process of the invention, the precursor compounds may be reacted with the desired microelectronic device surface or substrate in any suitable manner, for example, in a single wafer chamber, a multi-wafer chamber, or in a furnace containing multiple wafers.

As used herein, the term "reducing gas", means gases chosen from hydrogen ($H_2$), diborane ($B_2H_6$), silane ($SiH_4$), disilane ($Si_2H_6$). In specific cases, nitrogen-containing reducing gases such as ammonia ($NH_3$), hydrazine ($N_2H_4$); $C_1$-$C_4$ alkyl hydrazines, such as methyl hydrazine, t-butyl hydrazine, 1,1-dimethylhydrazine, and 1,2-dimethylhydrazine can be useful, but under some conditions will lead to Mo or W nitride films instead of pure metal films. Likewise, in specific cases, carbon-containing reducing gases such as alkanes, alkenes, and alkynes can be useful, but under some conditions will lead to Mo or W carbide films instead of pure metal films. In one embodiment, the reducing gas is hydrogen.

The process disclosed herein may involve one or more purge gases as optional steps between the introduction of the metal precursor and the reducing gas, as well as carrier gas. The purge or carrier gas, which is used to either purge away unconsumed reactants and/or reaction by-products, or serve as a diluent and carrier for the metal precursor and reducing gas, is an inert gas that does not react with the precursors. Exemplary gases include, but are not limited to, argon, nitrogen, helium, neon, and mixtures thereof. In certain embodiments, a purge gas such as Ar is supplied into the reactor at a flow rate ranging from about 10 to about 10000 sccm for about 0.1 to 1000 seconds, thereby purging the unreacted material and any by-product that may remain in the reactor. Otherwise, such inert gases may be utilized as carrier gases to vary the concentration of the molybdenum or tungsten precursor and/or reducing gas as used herein.

As used herein, the term "microelectronic device" corresponds to semiconductor substrates, including 3D NAND structures, logic devices, DRAM, power devices, flat panel displays, and microelectromechanical systems (MEMS), manufactured for use in microelectronic, integrated circuit, or computer chip applications. It is to be understood that the term "microelectronic device" is not meant to be limiting in any way and includes any substrate that includes a n-type channel metal oxide semiconductor (nMOS) and/or a p-type channel metal oxide semiconductor (pMOS) transistor and will eventually become a microelectronic device or microelectronic assembly. In addition, the underlying substrate need not be silicon, but could be insulators such as glass or sapphire, high bandgap semiconductors such as SiC or GaN, or other materials useful in the manufacture of electrical circuits. Such microelectronic devices contain at least one substrate, which can be chosen from, for example, silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, germanium, germanium-containing, boron-containing, Ga/As, a flexible substrate, porous inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

EXAMPLES

In the following examples, the values of thickness refer to a mass equivalent thickness measured by X-ray fluorescence. The measurement technique measures the number of Mo atoms per unit area on the substrate with a high precision. The theoretical density of Mo metal, about 10.28 g/cm$^3$, is used to convert this measured value to the mass equivalent thickness with the model that the film is uniform in thickness. It should be understood that films with poor nucleation and high roughness can be much thicker in some areas and even have no thickness (bare substrate) in some areas.

Example 1

Figure 1:
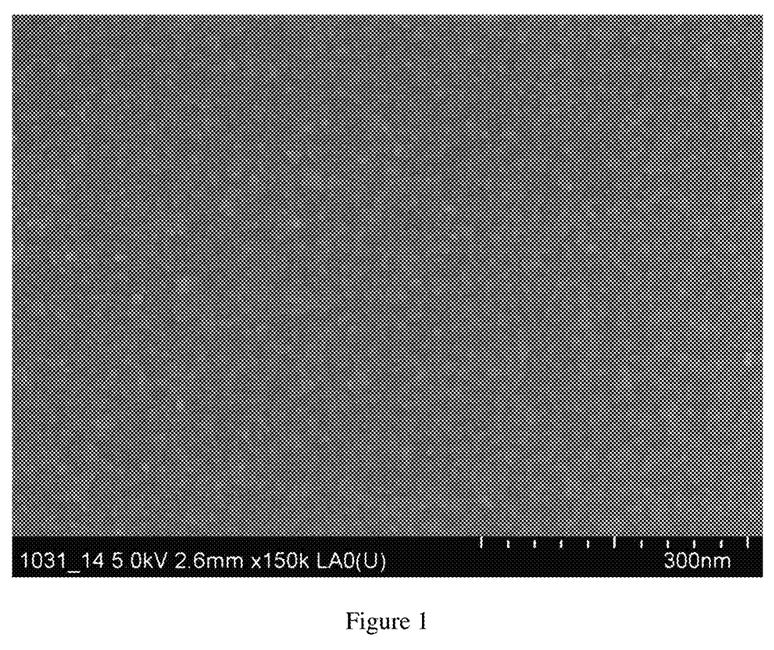
FIG. 1 is a scanning electron micrograph (SEM) of a nominally bare titanium nitride surface, with a mass equivalent thickness of 1.6 Å Mo, prepared via chemical vapor deposition (CVD) of Mo using $MoO_2Cl_2$ as precursor. Substrate temperature was 450° C.

A chemical vapor deposition method was utilized along with $MoO_2Cl_2$, at a TiN substrate temperature of 450° C. The ampoule temperature was 40° C., the carrier gas flow rate was 25 sccm, the $H_2$ was 500 sccm, which led to a concentration of 70 ppm at 80 Torr pressure. After 24 min, almost no Mo was deposited (1.6 Å mass equivalent thickness) and resistivity could not be measured for the thin Mo film. See FIG. 1.

Example 2

Figure 2:
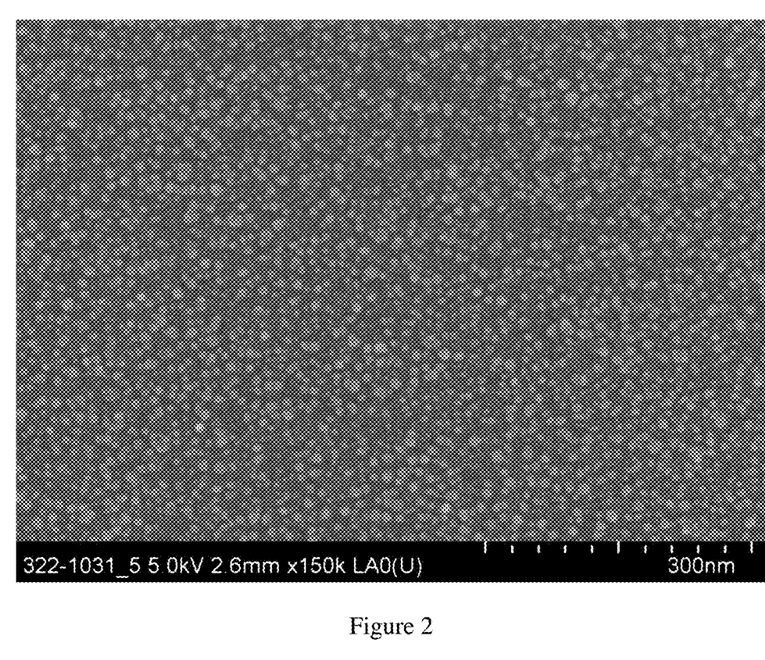
FIG. 2 is a SEM of a (comparative) example of the chemical vapor deposition of molybdenum using $MoO_2Cl_2$ on titanium nitride at a substrate temperature of 400° C. This example shows a poorly nucleated with a mass equivalent thickness of 9.9 Å Mo on the surface, where only molybdenum oxide phase was apparent by X-ray diffraction.

A chemical vapor deposition method was utilized along with $MoO_2Cl_2$, at a TiN substrate temperature of 400° C. The ampoule temperature was 60° C., the carrier gas flow rate was 50 sccm, the $H_2$ was 4000 sccm, which led to a concentration of 20 ppm at 80 Torr pressure. After 10 minutes, a discontinuous 9.9 Å film with isolated nucleation sites resulted and deposited and resistivity was not measurable. See FIG. 2.

Example 3

Figure 3:
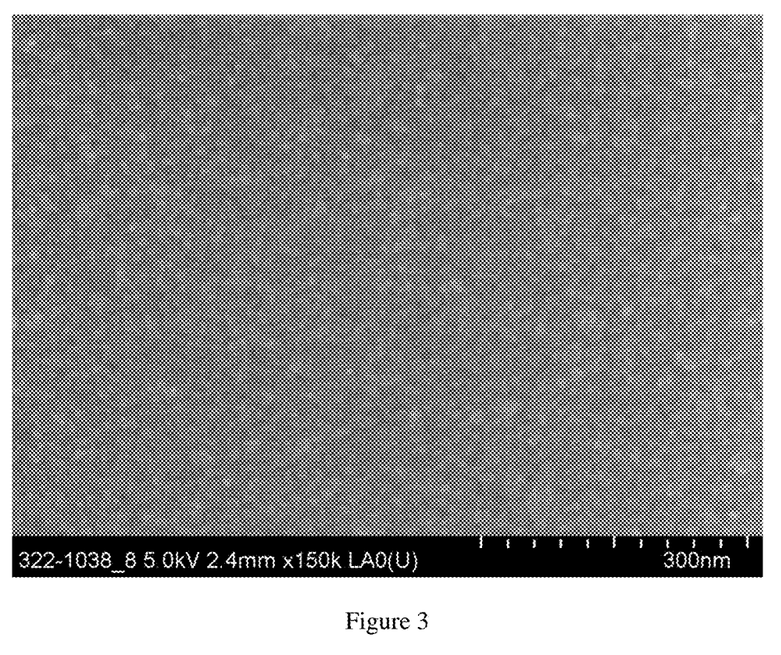
FIG. 3 is a SEM showing the deposition/nucleation of molybdenum on a titanium nitride substrate using the process of the invention (and a substrate temperature of 390° C.) The Mo film has a mass equivalent thickness of 9.4 Å. (See Example 1, below.)

A pulsed chemical vapor deposition method was utilized along with $MoO_2Cl_2$, at a TiN substrate temperature of 390° C. The ampoule temperature was 40° C., the carrier gas flow rate was 20 sccm, the $H_2$ was 1000 sccm, which led to a concentration of 22 ppm at 80 Torr pressure. After 20 cycles, a smooth 9.4 Å Mo film resulted with a resistivity of 222 μΩ-cm. See FIG. 3. This example illustrates that concentration is generally lower for pulsed regimes due to pulse time "on" versus pulse time "off" and dilution which occurs over time. The concentration which is reached at the surface is thus not necessarily what remains on the surface to react with the reducing gas over time. Accordingly, the effective concentration of precursor at the surface over time is less for pulsed CVD regimes versus (continuous) CVD regimes.

Example 4

A pulsed chemical vapor deposition method was utilized along with $MoO_2Cl_2$, at a SiN substrate temperature of 400° C. The ampoule temperature was 40° C., the carrier gas flow rate was 20 sccm, the $H_2$ was 1000 sccm, which led to a concentration of 22 ppm at 80 Torr pressure. After 200 cycles, a 125.3 Å film, on via structure. Good Mo film resulted with an AFM RMS roughness of 0.684 nm. See FIG. 4.

Example 5

Figure 5:
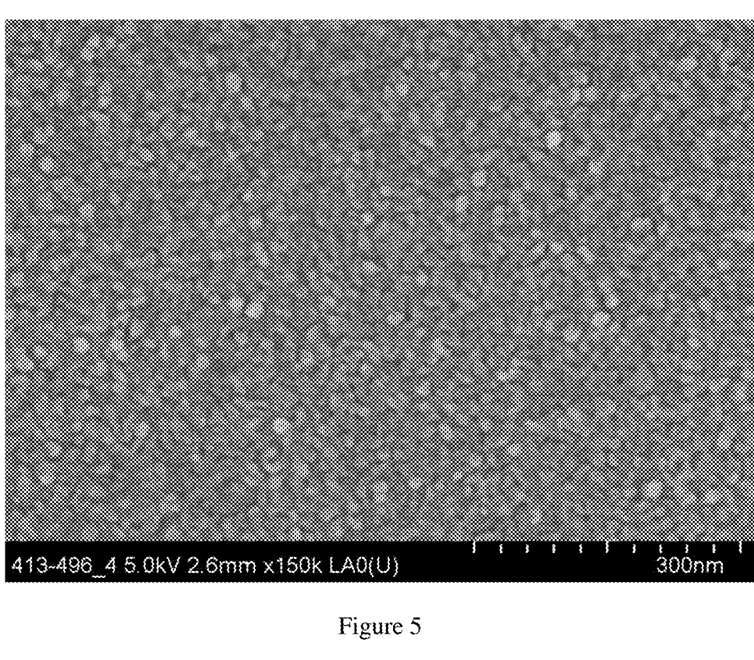
FIG. 5 is a SEM of a film of Mo with mass equivalent thickness of 104 Å deposited on a PVD Mo substrate. CVD conditions were: $T_{sub}$=390° C., low Precursor concentration 30 ppm. This data shows that PVD Mo substrate is a comparable starting surface to the Mo nucleation step prior to bulk Mo deposition.

A chemical vapor deposition method was utilized along with $MoO_2Cl_2$, at a PVD Mo substrate temperature of 390° C. The ampoule temperature was 40° C., the carrier gas flow rate was 20 sccm, the $H_2$ was 1000 sccm, which led to a concentration of 30 ppm at 80 Torr pressure. After 20 minutes, a 104.4 Å of Mo film was added to 100 Å PVD Mo substrate. Resistivity of CVD Mo film was 17 μΩ-cm. Good Mo film resulted displaying high deposition rate of CVD Mo on PVD Mo for a substrate temperature of 390° C. See FIG. 5.

Example 6

Figure 6:
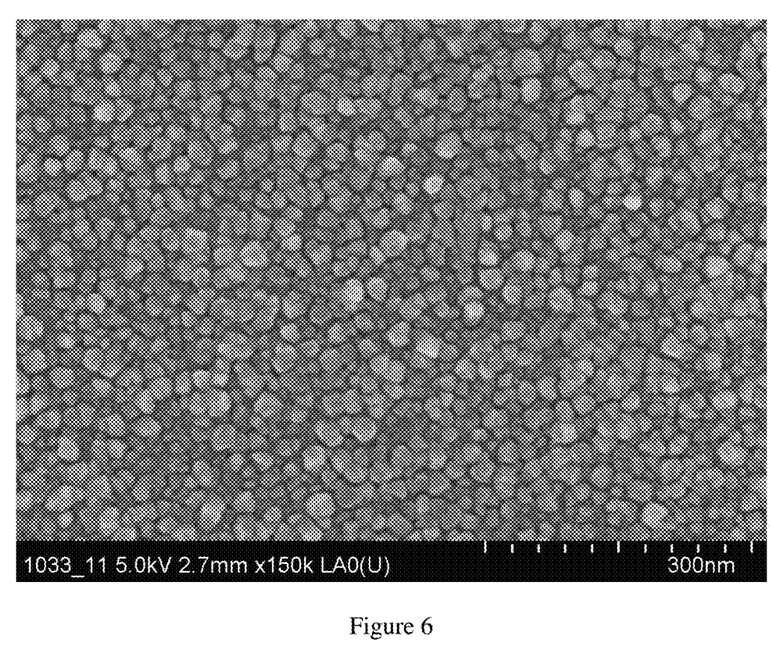
FIG. 6 is a SEM of a film of Mo with a mass equivalent thickness of 102 Å deposited by CVD on a TiN substrate. Deposition conditions: $T_{sub}$=450° C., precursor concentration=37 ppm. This is near the lower limit of substrate temperature for which this concentration allows for the deposition of Mo on TiN.

A chemical vapor deposition method was utilized along with $MoO_2Cl_2$, at a TiN substrate temperature of 450° C. The ampoule temperature was 40° C., the carrier gas flow rate was 25 sccm, the $H_2$ was 1000 sccm, which led to a concentration of 37 ppm at 80 Torr pressure. After 20 minutes, a 101.9 Å film, was deposited with a resistivity of 34.4 μΩ-cm. A rough CVD Mo film could be deposited on TiN at substrate temperature of 450° C. when the precursor concentration was dropped by 2X compared to Example 1. See FIG. 6.

Example 7

Figure 7:
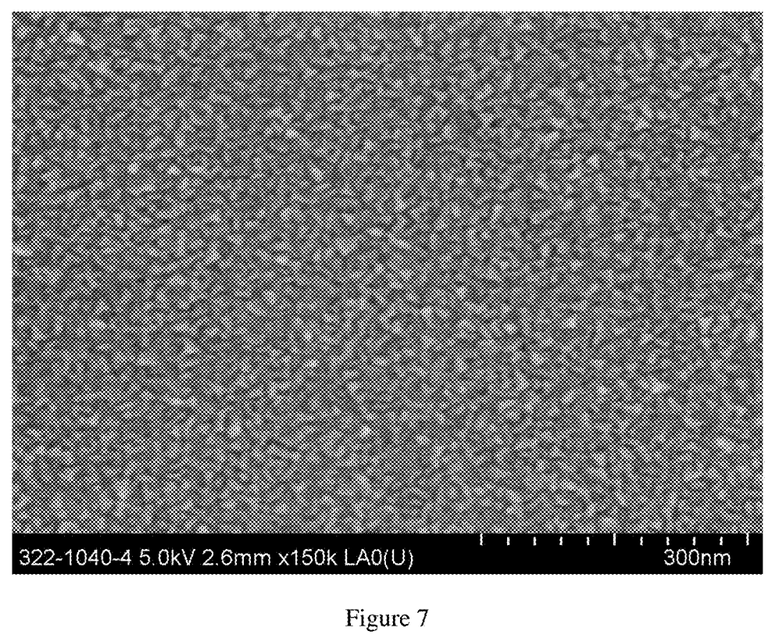
FIG. 7 is a SEM of a Mo film deposited in 2 steps on a TiN substrate. The mass equivalent thickness of the Mo is 108 Å. Deposition temperature was $T_{sub}$=390° C.; the pulsed CVD nucleation layer used a low Precursor concentration 22 ppm; the bulk CVD deposition used a precursor concentration of 30 ppm. This data shows Mo nucleation step creates suitable (comparable starting surface to PVD Mo substrate) for bulk Mo deposition.
Figure 8:
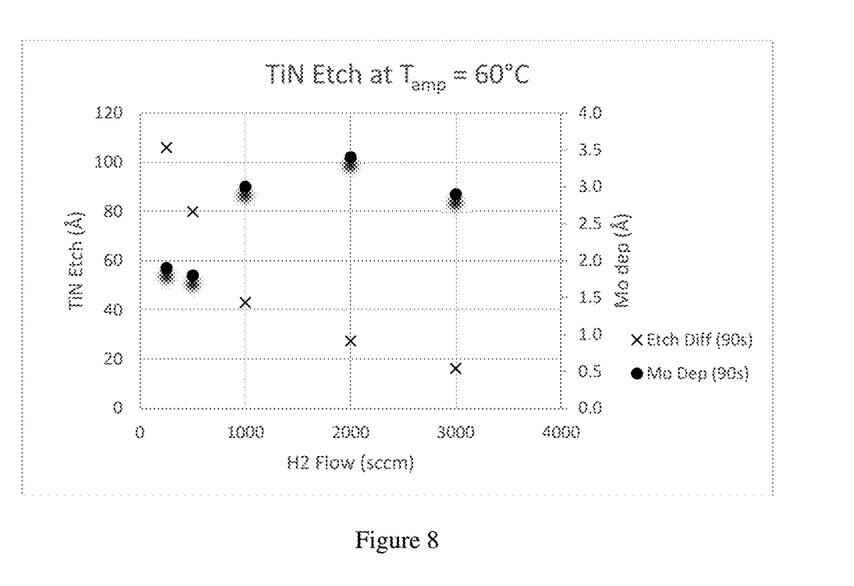
FIG. 8 s a plot of TiN etching in Å versus $H_2$ flow (sccm). This data shows that increasing the $H_2$ flow decreases the precursor concentration, and illustrates how decreasing the concentration during nucleation step can reduce substrate (TiN) etching.
Figure 9:
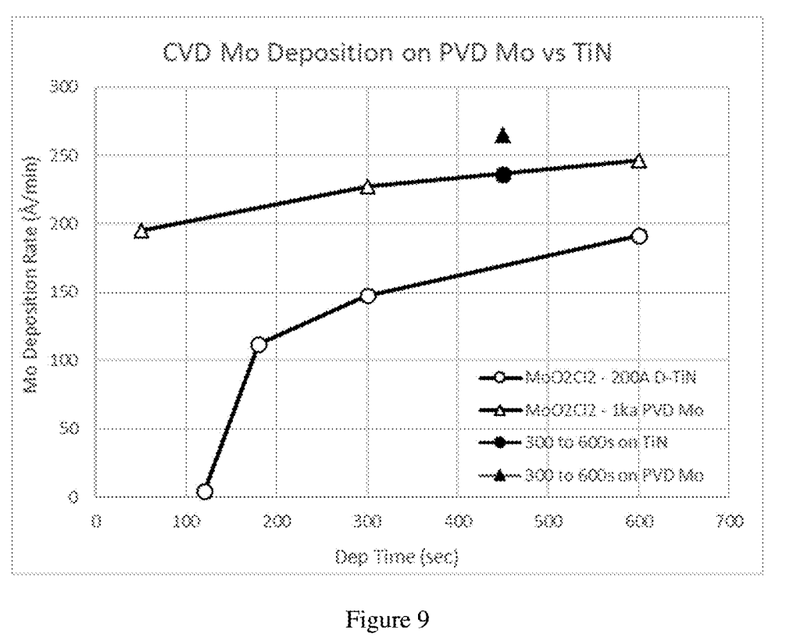
FIG. 9 is a comparison of CVD Molybdenum deposition rate on Titanium Nitride substrate and PVD Molybdenum substrate as a function deposition time. Substrate temperature=650° C., Pressure=80 Torr, Argon carrier gas flow=50 sccm, Hydrogen co-reactant gas flow=4000 sccm. The graph shows the impact of nucleation delay on deposition rate. The graph also shows Molybdenum deposition rate on Titanium Nitride in the period from 300 seconds to 600 seconds has increased by at least 25% when depositing on Mo versus TiN substrates. Precursor concentration=20 ppm.

A 2-Step chemical vapor deposition method was utilized along with $MoO_2Cl_2$, at a TiN Mo substrate temperature of 390° C. The ampoule temperature was 40° C., the carrier gas flow rate was 20 sccm, the $H_2$ was 1000 sccm and the pressure was 80 Torr. In one experiment, a first step was a 45 cycle pulsed CVD nucleation step at a concentration of 22 ppm, a 23.5 Å thick Mo layer was deposited on the TiN substrate. In a second experiment, a first step was performed for 45 cycles according to the conditions described above. Immediately thereafter, a second step employed a CVD method using the same conditions as the first step except with a higher concentration of 30 ppm. After 20 min, the total Mo film thickness was a 108 Å with ρ=17.7 μΩ-cm. A good Mo film resulted on the TiN substrate, with comparable resistivity and roughness of a CVD Mo film deposited directly on a PVD Mo substrate. This resistivity is half of the resistivity of the Mo film deposited without the low concentration nucleation layer in Example 6. See FIG. 7 (with respect to "part B").

The following comparative examples were generated using pulsed CVD nucleation at 20 sccm and 10 minutes CVD bulk deposition (Mo), $T_{sub}$=390° C. (substrate temperature); and $H_2$ =1000 sccm

| Comparative Example | Substrate | Nucleation Number of Cycles | Mo Thickness (Å) | Mo Deposition Rate (Å/cycle) | Ti Etched (Å) | Ti Etch Rate (Å/cycle) | Mo Resistivity (μΩ-cm) | XRD[1] |
|---|---|---|---|---|---|---|---|---|
| 1 | 250 Å TiN | 45 | 83.0 | 5.64 | 0.47 | 0.01 | 21.6 | Mo |
| 2 | 250 Å TiN | 30 | 37.7 | 2.30 | −0.29 | −0.1 | 43.4 | Mo, Large Spot |
| 3 | 250 Å TiN | 20 | 38.7 | 2.93 | 1.42 | 0.07 | 36.9 | Mo |
| 4 | 250 Å TiN | 15 | 15.6 | 0.84 | 0.47 | 0.03 | 152.1 | No Mo |

[1]XRD Material Composition

As can be seen in this data, the nucleation phase of deposition stops between about 10 and 25 Å as shown with deposition rate increasing from about 3 to 5.6 Å.

The following Table provides AFM roughness data comparing different thickness Mo nucleation layers, Mo deposition without a nucleation layer, and a very thick nucleation layer. Variations in nucleation layer thickness has little effect on final Mo film roughness and a large impact on bulk Mo deposition rate.

| | Substrate | Nucleation number of cycles | CVD Deposition Time (seconds) | Mo[1] | Mo[2] | Mo Resistivity (μΩ-cm) | XRD[3] | AFM[4] |
|---|---|---|---|---|---|---|---|---|
| 1 | 250 Å TiN | 45 | 600 | 83.0 | 7.12 | 21.6 | Mo | 0.794 |
| 2 | 250 Å TiN | 30 | 600 | 37.7 | 2.30 | 43.4 | Mo, Large Spot | 0.752 |
| 3 | 250 Å TiN | 20 | 600 | 38.7 | 2.93 | 36.9 | Mo | 0.781 |

-continued

|  | Substrate | Nucleation number of cycles | CVD Deposition Time (seconds) | Mo[1] | Mo[2] | Mo Resistivity (μΩ-cm) | XRD[3] | AFM[4] |
|---|---|---|---|---|---|---|---|---|
| 4 | 250 Å TiN | 15 | 600 | 15.6 | 0.84 | 152.1 | No Mo | 0.765 |
| 5 | 250 Å TiN | 0 | 600 | 11.4 | 1.14 | Not measurable | Very little deposition | 2.320 |
| 6 | 150 Å SiN Via | 200 | 0 | 125.0 | 0.63 | n/a | Shiny and uniform | 0.684 |

[1]Mo Thickness (Å)
[2]Mo CVD Deposition Rate
[3]XRD Material Composition
[4]AFM RMS Roughness (nm)

Aspects

In a first aspect, a process for the vapor deposition of a molybdenum or tungsten-containing film onto a surface, comprising introducing into a reaction zone containing the surface, a first precursor and a reducing gas until a film has a thickness of about 3 Å to about 25 Å has been deposited on the surface; introducing into the reaction zone, a second precursor and a reducing gas, until deposition of the film having a desired thickness is achieved, and wherein the first precursor concentration is about 1 to about 75 percent to the second precursor concentration in the reaction zone and wherein both first and second precursor can be the same precursor or different precursors.

In a second aspect, the invention provides the process of the first aspect, wherein the first precursor concentration is about 10 to about 50 percent of the second precursor concentration.

In a third aspect, the invention provides the process of the first or second aspect, wherein the surface is chosen from nitrides, oxides, metals, semiconductors, and superconductors.

In a fourth aspect, the invention provides a process for the vapor deposition of a molybdenum or tungsten-containing film onto the surface of a microelectronic device in a reaction zone, the reaction zone operated at a pressure of about 1 to about 1000 Torr and a temperature of about 300° C. to about 1000° C.; wherein the surface is chosen from nitrides, oxides, metals, semiconductors, and superconductors, which comprises:
a. repeatedly introducing into a reaction zone containing the surface, a molybdenum or tungsten precursor in a pulse for a duration of about 0.1 to about 120 seconds followed by a pause of about 1 to about 120 seconds, wherein a first concentration of the precursor in the reaction zone is about 1 to about 5000 ppm at its peak, while continuously introducing into the reaction zone a reducing gas, until a film having a thickness of about 3 Å to about 25 Å has been deposited, and
b. repeatedly introducing into a reaction zone containing the surface, a molybdenum or tungsten precursor in a pulse for a duration of about 0.1 to about 120 seconds, thereby reaching a second precursor concentration, followed by a pause of about 1 to about 120 seconds; wherein the second concentration of the precursor in the reaction zone is about 1.3 to about 100 times the first precursor concentration, while continuously introducing into the reaction zone a reducing gas, until a film having a desired thickness has been deposited.

In a fifth aspect, the invention provides the process of the fourth aspect, wherein the precursor is chosen from $WCl_6$, $WCl_5$, $WOCl_4$, $MoO_2Cl_2$, $MoCl_5$, and $MoOCl_4$.

In a sixth aspect, the invention provides the process of the fourth or fifth aspect, wherein the precursor is $MoO_2Cl_2$.

In a seventh aspect, the invention provides the process of the fourth, fifth, or sixth aspect, wherein the pressure in the reaction zone is about 20 to about 200 Torr.

In an eighth aspect, the invention provides the process of any one of the fourth through the seventh aspects, wherein the first concentration of the precursor is about 20 to about 500 ppm.

In a nineth aspect, the invention provides the process of any one of the fourth through the eighth aspects, wherein the temperature in the reaction zone is about 350° to 500° C.

In a tenth aspect, the invention provides a process for the vapor deposition of a molybdenum or tungsten-containing film onto the surface of a microelectronic device in a reaction zone, the reaction zone operated at a pressure of about 1 to about 1000 Torr and a temperature of about 300° C. to about 1000° C.; wherein the surface is chosen from nitrides, oxides, metals, semiconductors, and superconductors, which comprises:
a. continuously introducing into a reaction zone containing the surface, a molybdenum or tungsten precursor, wherein a first concentration of the precursor in the reaction zone is about 1 to about 5000 ppm at its peak, while continuously introducing into the reaction zone a reducing gas until a film having a thickness of about 3 Å to about 25 Å has been deposited, and
b. continuously introducing into a reaction zone containing the surface, a molybdenum or tungsten precursor, thereby reaching a second precursor concentration, wherein the second concentration of the precursor in the reaction zone is about 1.3 to about 100 times the first precursor concentration, while continuously introducing into the reaction zone a reducing gas, until a film having a desired thickness has been deposited.

In an eleventh aspect, the invention provides the process of the tenth aspect, wherein the precursor is chosen from $WCl_6$, $WCl_5$, $WOCl_4$, $MoO_2Cl_2$, $MoCl_5$, and $MoOCl_4$.

In a twelfth aspect, the invention provides the process of the tenth or eleventh aspects, wherein the precursor is $MoO_2Cl_2$.

In a thirteenth aspect, the invention provides the process of any one of the tenth through the twelfth aspects, wherein the pressure in the reaction zone is about 20 to about 200 Torr.

In a fourteenth aspect, the invention provides the process of any one of the tenth through the thirteenth aspects, wherein the first concentration of the precursor is about 20 to about 500 ppm.

In a fifteenth aspect, the invention provides the process of any one of the tenth through the fourteenth aspects, wherein the temperature in the reaction zone is about 350° to 500° C.

In a sixteenth aspect, the invention provides a process for the vapor deposition of a molybdenum or tungsten-containing film onto a surface of a microelectronic device in a reaction zone, the reaction zone operated at a pressure of about 1 to about 1000 Torr and a temperature of about 300° C. to about 1000° C.; wherein the surface is chosen from nitrides, oxides, metals, semiconductors, and superconductors, which comprises:

a. repeatedly introducing into the reaction zone containing the surface, a molybdenum or tungsten precursor for a first pulse duration of about 0.1 to about 120 seconds, thereby reaching a first concentration of the precursor in the reaction zone, wherein the first concentration of the precursor in the reaction zone is about 1 to about 5,000 ppm, and purging the reaction zone for about 1 to about 120 seconds with an inert gas, and introducing into the reaction zone a reducing gas for a second pulse duration of about 0.1 to about 120 seconds, and purging with an inert gas for a duration of about 1 to about 120 seconds, until a film having a thickness of about 3 Å to about 25 Å has been deposited, and b. repeatedly introducing into the reaction zone containing the surface, a molybdenum or tungsten precursor for a first pulse duration of about 0.1 to about 120 seconds, thereby reaching a second precursor concentration in the reaction zone, wherein the second concentration of the precursor in the reaction zone is about 1.3 to about 100 times the first concentration, and purging the reaction zone for about 1 to about 120 seconds with an inert gas, and introducing into the reaction zone a reducing gas for a second pulse duration of about 0.1 to about 120 seconds, and purging with an inert gas for a duration of about 1 to about 120 seconds, until a film having a desired thickness has been deposited.

In a seventeenth aspect, the invention provides the process of the sixteenth aspect, wherein the precursor is chosen from $WCl_6$, $WCl_5$, $WOCl_4$, $MoO_2Cl_2$, $MoCl_5$, and $MoOCl_4$.

In an eighteenth aspect, the invention provides the process of the sixteenth or seventeenth aspect, wherein the precursor is $MoO_2Cl_2$.

In a nineteenth aspect, the invention provides the process of any one of the sixteenth through eighteenth aspects, wherein the pressure in the reaction zone is about 20 to about 200 Torr.

In a twentieth aspect, the invention provides the process of any one of the sixteenth through the nineteenth aspects, wherein the first concentration of the precursor is about 20 to about 500 ppm.

In a twenty-first aspect, the invention provides the process of the twentieth aspect, wherein the temperature in the reaction zone is about 350° to 500° C.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. The disclosure's scope is, of course, defined in the language in which the appended claims are expressed.

What is claimed is:

1. A process for the vapor deposition of a molybdenum or tungsten-containing film onto a surface, comprising:
   introducing into a reaction zone containing the surface, a precursor at a first precursor concentration and a reducing gas until a film has a thickness of about 3 Å to about 25 Å has been deposited on the surface;
   introducing into the reaction zone, the precursor at a second precursor concentration and a reducing gas, until deposition of the film having a desired thickness is achieved, and
   wherein the first precursor concentration is about 1 to about 75 percent to the second precursor concentration in the reaction zone and wherein the film with a thickness of about 3 Å to about 25 Å is deposited with a smooth surface morphology.

2. The process of claim 1, wherein the first precursor concentration is about 10 to about 50 percent of the second precursor concentration.

3. The process of claim 1, wherein the surface is chosen from nitrides, oxides, metals, semiconductors, and superconductors.

4. A process for the vapor deposition of a molybdenum or tungsten-containing film onto the surface of a microelectronic device in a reaction zone, the reaction zone operated at a pressure of about 1 to about 1000 Torr and a temperature of about 300° C. to about 1000° C.; wherein the surface is chosen from nitrides, oxides, metals, semiconductors, and superconductors, which comprises:

a. repeatedly introducing into a reaction zone containing the surface, a molybdenum or tungsten precursor in a pulse for a duration of about 0.1 to about 120 seconds followed by a pause of about 1 to about 120 seconds, wherein a first precursor concentration in the reaction zone is about 1 to about 5000 ppm at its peak, while continuously introducing into the reaction zone a reducing gas, until a film having a thickness of about 3 Å to about 25 Å has been deposited with a smooth surface morphology, and b. repeatedly introducing into a reaction zone containing the surface, the molybdenum or tungsten precursor in a pulse for a duration of about 0.1 to about 120 seconds, thereby reaching a second precursor concentration, followed by a pause of about 1 to about 120 seconds; wherein the second precursor concentration is about 1.3 to about 100 times the first precursor concentration, while continuously introducing into the reaction zone a reducing gas, until a film having a desired thickness has been deposited.

5. The process of claim 4, wherein the precursor is chosen from $WCl_6$, $WCl_5$, $WOCl_4$, $MoO_2Cl_2$, $MoCl_5$, and $MoOCl_4$.

6. The process of claim 4, wherein the precursor is $MoO_2Cl_2$.

7. The process of claim 4, wherein the pressure in the reaction zone is about 20 to about 200 Torr.

8. The process of claim 4, wherein the first precursor concentration is about 20 to about 500 ppm.

9. The process of claim 4, wherein the temperature in the reaction zone is about 350° to 500° C.

10. A process for the vapor deposition of a molybdenum or tungsten-containing film onto a surface of a microelectronic device in a reaction zone, the reaction zone operated at a pressure of about 1 to about 1000 Torr and a temperature of about 300° C. to about 1000° C.;
   wherein the surface is chosen from nitrides, oxides, metals, semiconductors, and superconductors, which comprises:

a. continuously introducing into a reaction zone containing the surface, a molybdenum or tungsten precursor, wherein a first precursor concentration in the reaction zone is about 1 to about 5000 ppm at its peak, while continuously introducing into the reaction zone a reducing gas until a film having a thickness of about 3 Å to about 25 Å has been deposited with a smooth surface morphology, and b. continuously introducing into a reaction zone containing the surface, the molybdenum or tungsten precursor, thereby reaching a second precursor concentration, wherein the second precursor concentration in the reaction zone is about 1.3 to about 100 times the first precursor concentration, while continuously introducing into the reaction zone a reducing gas, until a film having a desired thickness has been deposited.

11. The process of claim 10, wherein the precursor is chosen from $WCl_6$, $WCl_5$, $WOCl_4$, $MoO_2Cl_2$, $MoCl_5$, and $MoOCl_4$.

12. The process of claim 10, wherein the precursor is $MoO_2Cl_2$.

13. The process of claim 10, wherein the pressure in the reaction zone is about 20 to about 200 Torr.

14. The process of claim 10, wherein the first precursor concentration is about 20 to about 500 ppm.

15. The process of claim 10, wherein the temperature in the reaction zone is about 350° to 500° C.

* * * * *